US012228626B2

(12) United States Patent
Sheldon et al.

(10) Patent No.: US 12,228,626 B2
(45) Date of Patent: Feb. 18, 2025

(54) EYEWEAR HAVING MULTIDIRECTIONAL VENTING

(71) Applicant: Brent Sheldon, Miami Beach, FL (US)

(72) Inventors: Brent Sheldon, Miami Beach, FL (US); Guy Brousseau, Jr., Marieville (CA)

(73) Assignee: Brent Sheldon, Miami Beach, FL (US)

( * ) Notice: Subject to any disclaimer, the term of this patent is extended or adjusted under 35 U.S.C. 154(b) by 433 days.

(21) Appl. No.: 17/535,155

(22) Filed: Nov. 24, 2021

(65) Prior Publication Data

US 2022/0082869 A1    Mar. 17, 2022

Related U.S. Application Data

(63) Continuation of application No. PCT/CA2020/051455, filed on Oct. 29, 2020.

(60) Provisional application No. 62/930,738, filed on Nov. 5, 2019.

(51) Int. Cl.
*G01R 33/422* (2006.01)
*G01R 33/34* (2006.01)
*G02C 11/08* (2006.01)

(52) U.S. Cl.
CPC ..... *G01R 33/422* (2013.01); *G01R 33/34076* (2013.01); *G02C 11/08* (2013.01)

(58) Field of Classification Search
CPC . G02C 11/08; G01R 33/422; G01R 33/34076
USPC .......................................... 351/62, 158, 141
See application file for complete search history.

(56) References Cited

U.S. PATENT DOCUMENTS

| 5,638,145 | A | 6/1997 | Jannard et al. |
| 6,783,235 | B1* | 8/2004 | Lin .......................... A61F 9/028 |
| | | | 2/435 |
| D585,476 | S | 1/2009 | Yang |
| D619,160 | S | 7/2010 | Sheldon |
| D683,784 | S | 6/2013 | Miera |
| D835,180 | S | 12/2018 | Miera |
| D845,380 | S | 4/2019 | Sheldon |
| D857,787 | S | 8/2019 | Miera |
| D870,802 | S | 12/2019 | Canales et al. |
| D880,575 | S | 4/2020 | Thixton |
| D922,474 | S | 6/2021 | Sheldon et al. |
| 2004/0263773 | A1* | 12/2004 | Lane ..................... G02C 11/08 |
| | | | 351/41 |
| 2008/0047050 | A1 | 2/2008 | Hooper et al. |

(Continued)

FOREIGN PATENT DOCUMENTS

NO    20 040 008 U1    2/2005

OTHER PUBLICATIONS

Green, D.; International Search Report from corresponding PCT Application No. PCT/CA2020/051455; search completed Jan. 4, 2021.

(Continued)

*Primary Examiner* — Sharrief I Broome

(57) ABSTRACT

A multidirectional vent or a plurality of multidirectional vents can be integrated into eyewear to allow venting of eyewear. The vents can be ramped and angled in different directions for increased airflow and multidirectional venting. Grooves can be created on the lens of the eyewear and/or the frame portion such that when the lens are joined to the frame portion, vents are formed. The vents may also comprise ribs extending from the frame portion to allow the air to be directed in a controlled and precise manner.

8 Claims, 25 Drawing Sheets

(56) References Cited

U.S. PATENT DOCUMENTS

| | | |
|---|---|---|
| 2011/0296596 A1 | 12/2011 | Chen |
| 2014/0063437 A1* | 3/2014 | Cater .................... G02C 11/08 |
| | | 351/62 |
| 2016/0259184 A1* | 9/2016 | Sheldon ............... B29C 39/123 |
| 2017/0100287 A1* | 4/2017 | Calilung ................ A61F 9/026 |

OTHER PUBLICATIONS

Comaxsun Polarized Sports Sunglasses; https://www.amazon.com/dp/B0829YYFW8/; posted Dec. 27, 2019.
Flex V2 Polarized Sunglasses; https://www.amazon.com/FLEX-Polarized-Sunglasses-Lightweight-Cycling/dp/B07Q364Q767th=1; posted Nov. 16, 2019.
Rawlings Sport Youth Baseball Sunglasses; https://www.amazon.com/dp/B07C2YGVJJ/; posted Nov. 20, 2018.
Tifosi Intense Sunglasses; htlps://www.amazon.com/dp/B07DLCWSFX/; posted Nov. 17, 2009.
Supplementary European Search Report issued on corresponding EP application No. 20884623, dated Oct. 27, 2023.

* cited by examiner

EYEWEAR HAVING MULTIDIRECTIONAL VENTING

CROSS-REFERENCE TO RELATED APPLICATIONS

The present application is a continuation of International PCT Application No. PCT/CA2020/051455 filed on Oct. 29, 2020, which claims priority from U.S. Provisional Application No. 62/930,783 filed on Nov. 5, 2019, both of which are incorporated herein by reference in their entireties.

TECHNICAL FIELD

The following relates generally to eyewear frames, and more specifically to such eyewear providing multidirectional venting.

BACKGROUND

Eyewear such as eyeglasses generally include a frame that supports one or more lenses. The frame typically includes a nose bridge or nose pieces that engage the user's nose to support the eyewear on the user's head. Eyeglasses also typically include a pair of arms attached to (or integral with) the frame, to further support the eyeglasses, e.g. by resting the arms on the user's ears or engaging their head in the temple region. Some eyewear may include other support elements such as straps or bands (e.g., in sports goggles), to seal against the wearer's face to inhibit the entry of foreign objects or wind to that area. Safety eyewear may also fit over a user's primary eyewear to protect the eyewear and the user. However, these arrangements can affect the wearer's vision as there can be some fogging of the lenses due to the perspiration and warmth emanating from the wearer's face or from insufficient air flow in that area.

To solve this problem, manufacturers of eyewear have included vents in the eyewear frame structure to allow moisture and heat to escape from the space between the eyewear and the wearer's face. However, such vents are often ineffective at reducing fogging of the lenses.

It is an object of the following to address at least one of the above-noted disadvantages.

SUMMARY

In one aspect, there is provided an eyewear frame comprising a lens portion and a frame portion coupled to the lens portion by an attachment mechanism. Lens grooves can be provided on the lens portion; and frame grooves can be provided on the frame portion. The lens grooves can be aligned with the frame grooves to form vents when the lens portion is coupled to the frame portion. The vents allow air to enter the lens. The lens grooves can be angled in a plurality of directions such that the air is directed in the plurality of directions by the angled grooves.

In another aspect, there is provided a method of producing eyewear having multidirectional vents. The method comprising the steps of forming lens grooves in a lens portion; forming frame grooves in a frame portion; and joining the frame portion to the lens portion such that the lens grooves are aligned with the frame grooves to form a vent. Furthermore, the lens grooves are angled in a plurality of directions such that the vent allows air to enter the eyewear so the air is directed in the plurality of directions.

BRIEF DESCRIPTION OF THE DRAWINGS

Embodiments will now be described with reference to the appended drawings wherein:

FIG. 5a is cross-sectional view of the eyewear assembly shown in FIG. 3, taken along line A-A;

FIG. 5b is an enlarged partial view of the eyewear assembly shown in FIG. 5a illustrating the airflow through the frame;

FIG. 5c is an enlarged partial view of the eyewear assembly shown in FIG. 5a;

DETAILED DESCRIPTION

It should also be noted that throughout the following description and claims, the terms "front"/"forward" and "back"/"rearward"("rear") refer to directions from the perspective of the user—i.e. further away from the user's face is referred to as "front" or "forward" and closer to the user's face is referred to as "back" or "rear".

Figure 1:
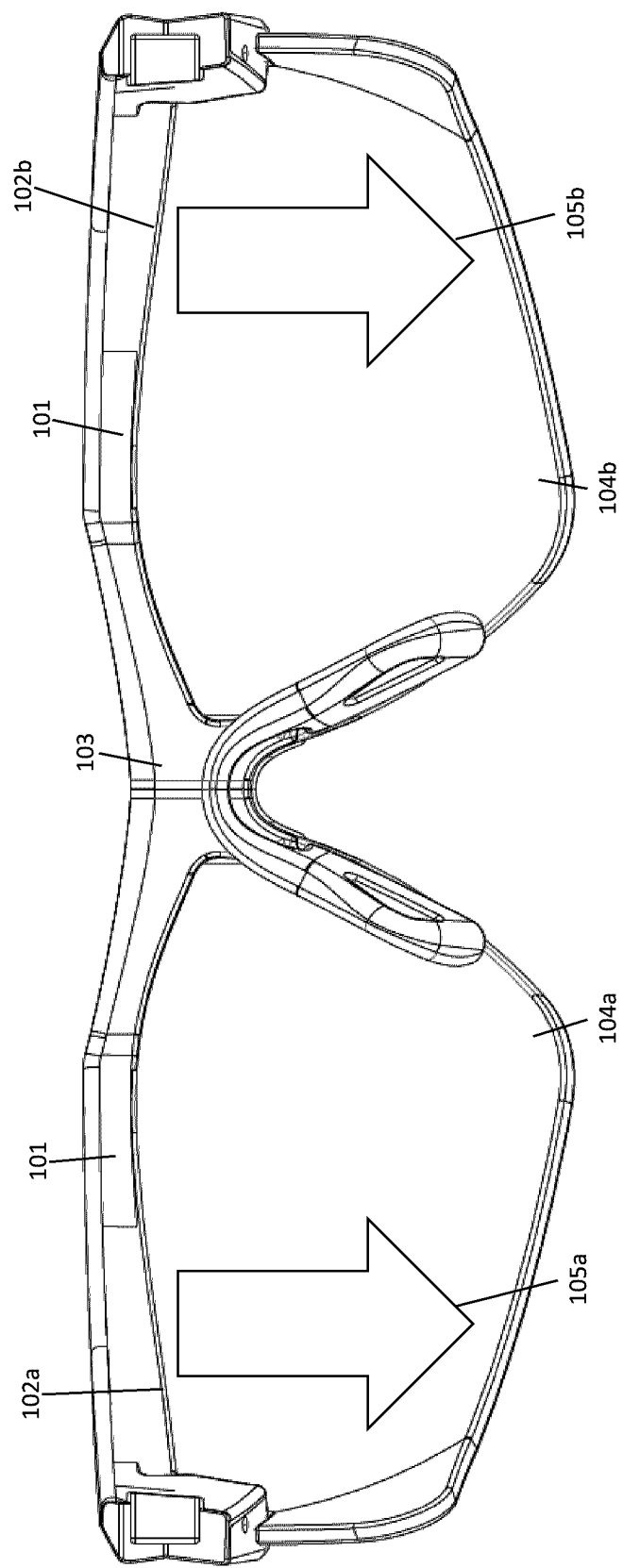
FIG. 1 is a rear plan view of a prior art eyewear assembly having traditional vents incorporated into the frame.

FIG. 1 provides a rear view of a prior art eyewear assembly having traditional vents 102a, 102b incorporated into a frame 101. The vents 102 are located between the frame 101 and the lens 104. The vents 102 may allow moisture and heat to escape from the space between the eyewear and the wearer's face, however, these vents 102 tend to restrict airflow in a downward direction and may not reach throughout the extent of the area between the eyewear and the user's face. As it can be seen from the arrows 105a, 105b which indicate airflow throughout the lens, the airflow is unidirectional. It has been found that such unidirectional airflow may not be effective at reducing fogging of the lens and may only reduce fogging on one side of the lens. To overcome this drawback and improve the circulation of airflow between eyewear and the user's face, a multi-directional venting arrangement is used, as shown in FIG. 2.

Figure 2:
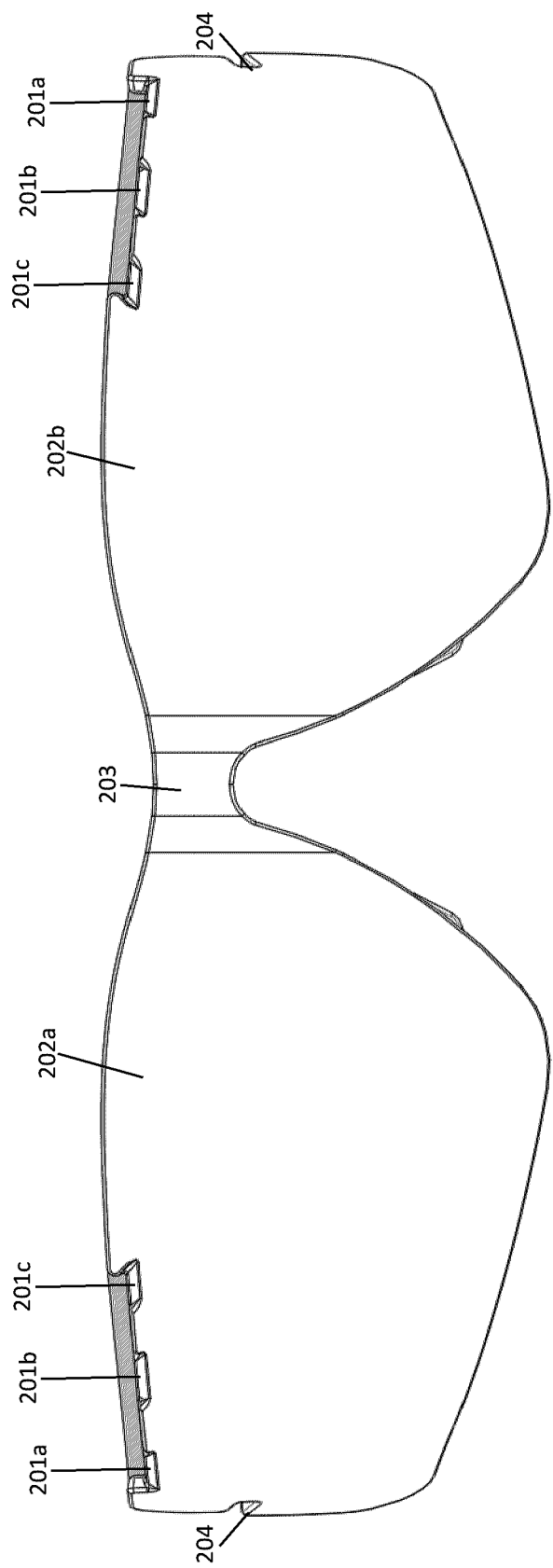
FIG. 2 is a front partial view of an eyewear assembly having multidirectional vents.

FIG. 2 provides a front view of eyewear lens 202a, 202b. Grooves 201 can be provided on the lens 202, such that air can flow through the lens 202. The grooves 201 located on the lens 202 of the eyewear are herein referred to as lens grooves 201. It can be appreciated that any number of lens grooves 201 is possible, including a singular lens groove 201, however, a plurality of lens grooves 201 is preferred. The lens grooves 201 can be located at the edges of the lens 202, preferably where the frame portion is joined to the lens 202. The lens grooves 201 can be shaped such that the groove can be ramped towards the wearer's face (when a wearer is wearing the eyewear), such that air can easily travel into the space between the eyewear and the wearer. Furthermore, the lens grooves 201 can be angled in different directions to increase airflow throughout the eyewear and permit multidirectional venting. By way of example, lens groove 201a is angled downwards toward the bottom of the lens, lens groove 201b is angled towards the middle of the lens and lens groove 201c is angled towards the nose portion 203. This permits air to travel in and vent through the bottom of the lens, the middle of the lens and the inner portion of the lens substantially more equally than with a unidirectional flow.

Figure 3:
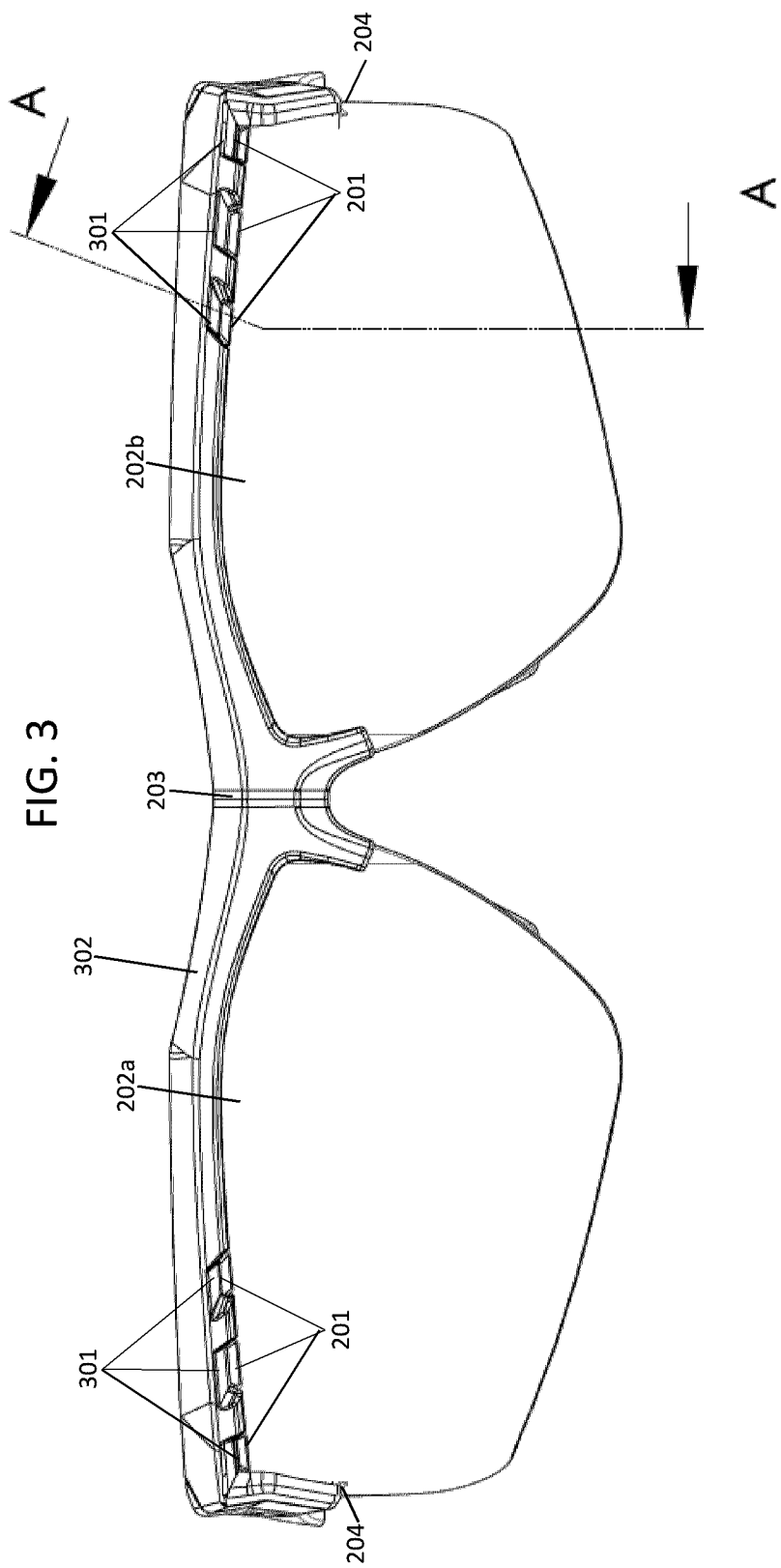
FIG. 3 is a front view of the eyewear assembly shown in FIG. 2.

FIG. 3 is a front view of the eyewear assembly shown in FIG. 2. The frame portion 302 can be coupled to the lens portion 202 using an attachment mechanism 204. The frame portion 302 can comprise a further set of grooves 301 complementary to the grooves 201 of the lens portion 202. The grooves located on the frame of the eyewear are herein referred to as frame grooves 301. The number of frame grooves 301 is preferably equal to the number of lens grooves 201. Furthermore, the frame grooves 301 are preferably shaped to match the lens grooves 201 such that the width of the lens grooves 201 is approximately equal to the width of the frame grooves 201. The frame groove 301 can be ramped towards the wearer's face (when a wearer is wearing the eyewear), such that air can easily travel into the space between the eyewear and the wearer. Frame grooves 301 can be created on the frame portion 302 such that when the lens grooves 201 are aligned with the frame grooves 301, multidirectional vents 310 are formed.

The eyewear provided comprises a lens portion 202 and a frame portion 302 coupled to the lens portion 202 by the attachment mechanism 204. Lens grooves 201 are provided on the lens portion 202; and frame grooves 301 located on the frame portion 302. The lens grooves 201 can be aligned with the frame grooves 301 to form vents 310 when the lens portion 202 is coupled to the frame portion 302. The vents 310 allow air to enter the area behind the lens. The lens grooves 201 can be angled in a plurality of directions such that the air is directed in the plurality of directions by the angled grooves.

Figure 4:
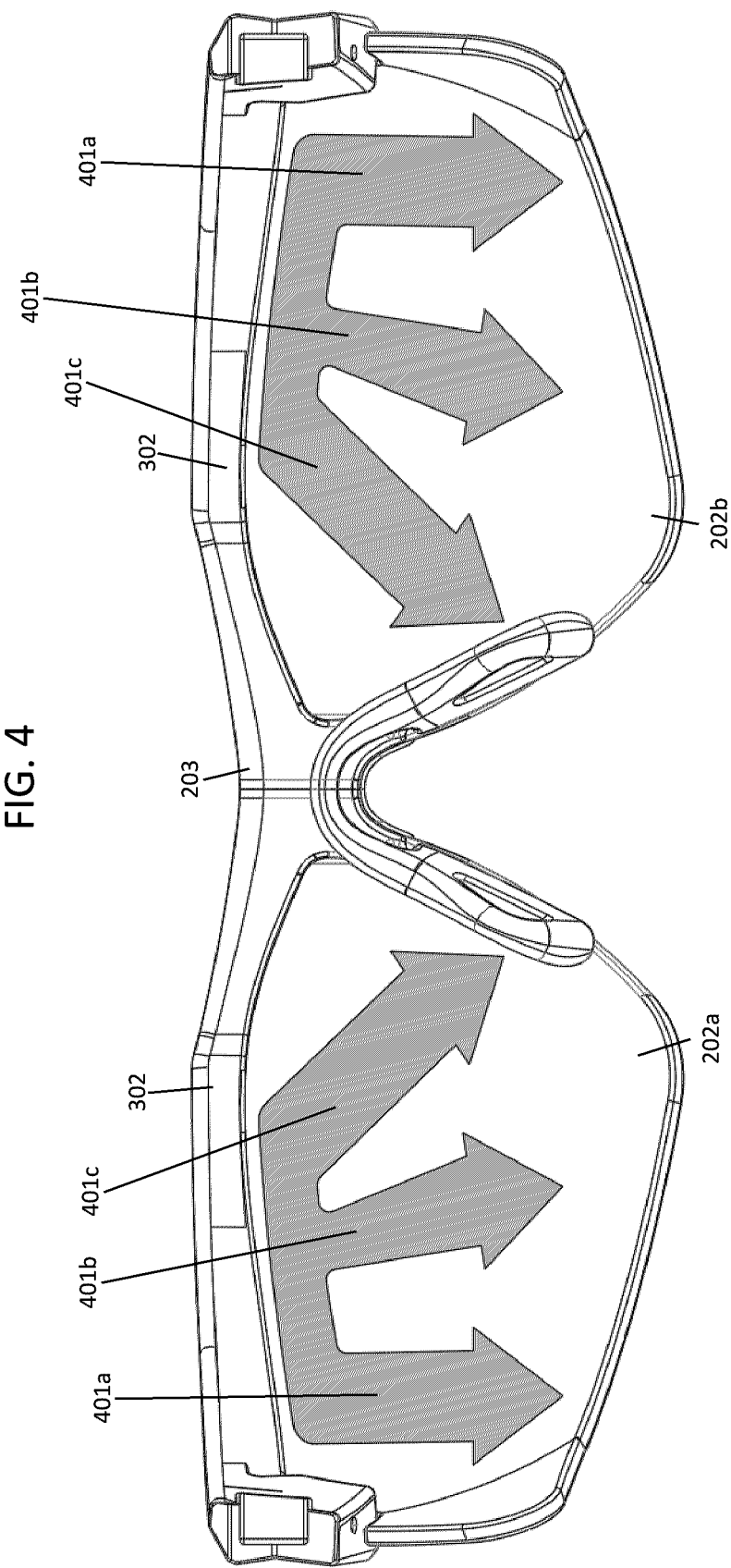
FIG. 4 is a rear view of an eyewear assembly having multidirectional vents incorporated into the frame.

FIG. 4 provides a rear view of an eyewear assembly having multidirectional vents 310 incorporated into the frame 302. The multidirectional venting is provided by the lens grooves 201 which can be angled in different directions. This increases airflow throughout the eyewear in many directions and permits multidirectional venting. In this embodiment, a first lens groove (not pictured) angles the airflow 401a downwards toward the bottom of the lens, a second lens groove (not pictured) angles the airflow 401b towards the middle of the lens and a third lens groove (not pictured) angles the airflow 401c towards the nose portion 203. The multi-directional airflow permits air to travel and vent the bottom of the lens, the middle of the lens and the inner portion of the lens equally.

Figure 5:
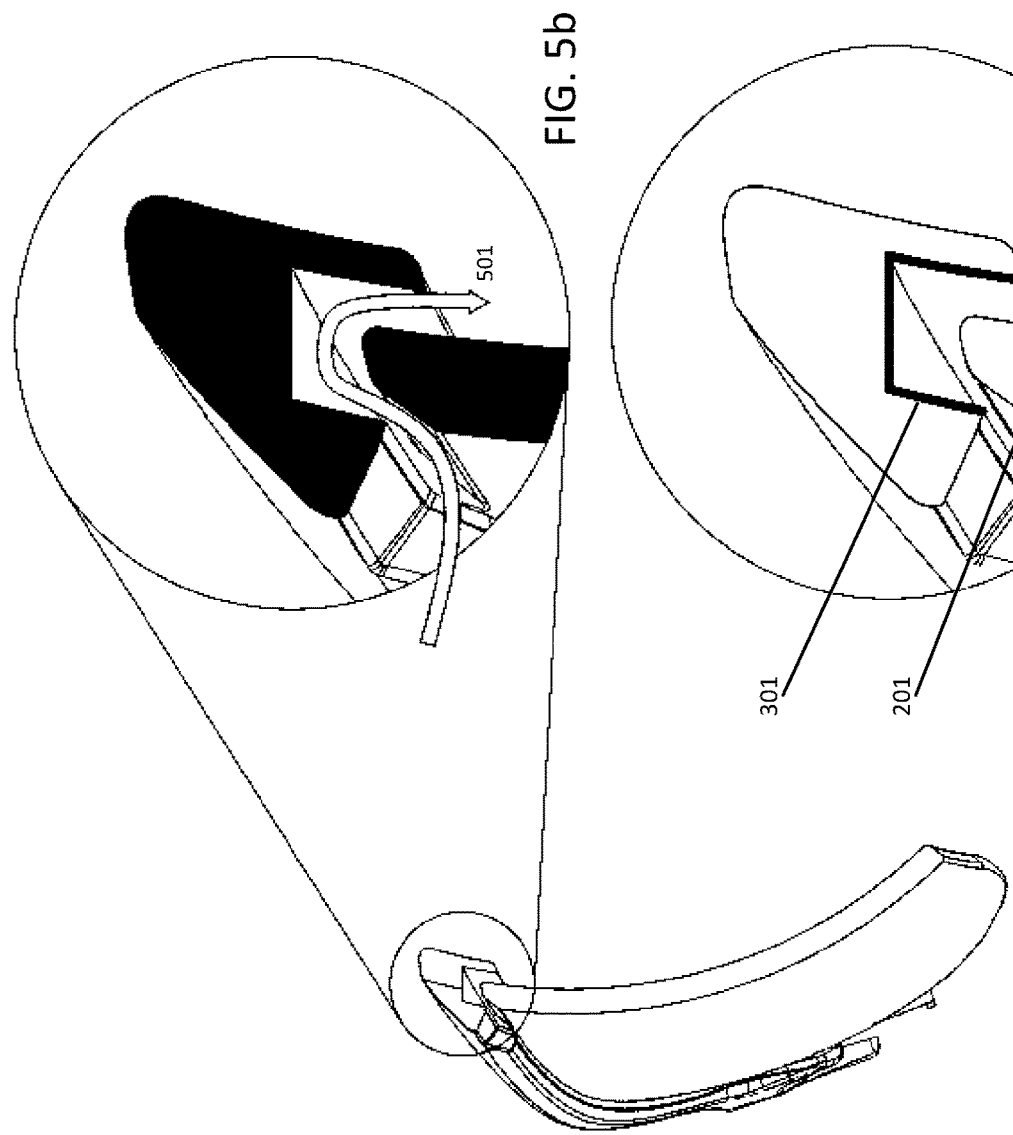

FIG. 5a provides a cross-sectional view of the eyewear assembly shown in FIG. 3, taken along line A-A. FIG. 5b provides an enlarged partial view of the eyewear assembly shown in FIG. 5a illustrating the airflow through the frame. It can be appreciated that the multi-directional vents 310 preferably do not allow air to enter the area behind the lens in a straight path. The airflow 401 is channeled through the grooves and may not follow a straight path. For example, in the embodiment shown in FIG. 5b, the vents 310 allow air to enter the grooves via a horizontal path, the air is then channeled vertically upwards towards the frame groove, and finally vertically downwards into the area behind the lens (airflow path shown by arrow 501). This allows the air to be directed in a specific manner. Furthermore, the grooves can be angled such that the airflow is directed to a region behind the lens which needs more ventilation. For example, the grooves can be angled sharply towards the nose to ventilate the area near the nose more than other areas. Thus, the angle of the grooves provided can alter and guide the airflow as needed. It can be appreciated that by using a greater number of grooves, the ability to redirect air in multiple different directions increases.

The lens groove 201 and the frame groove 301 together form a substantially horizontal passage section as well as a substantially vertical passage section which are in fluid communication with each other. Therefore, in combination, an "indirect" or L-shaped vent passage is formed extending through the frame structure. The "indirect" OR L-shaped vent passage therefore has an opening thereof on the front side of the frame and an opening on the back side of the frame. Therefore, the "indirect" or L-shaped vent passage allows effective moisture venting and air circulation while preventing foreign particles which pass through the vent passages from entering the user's eyes and from impacting the user's face.

Figure 6:
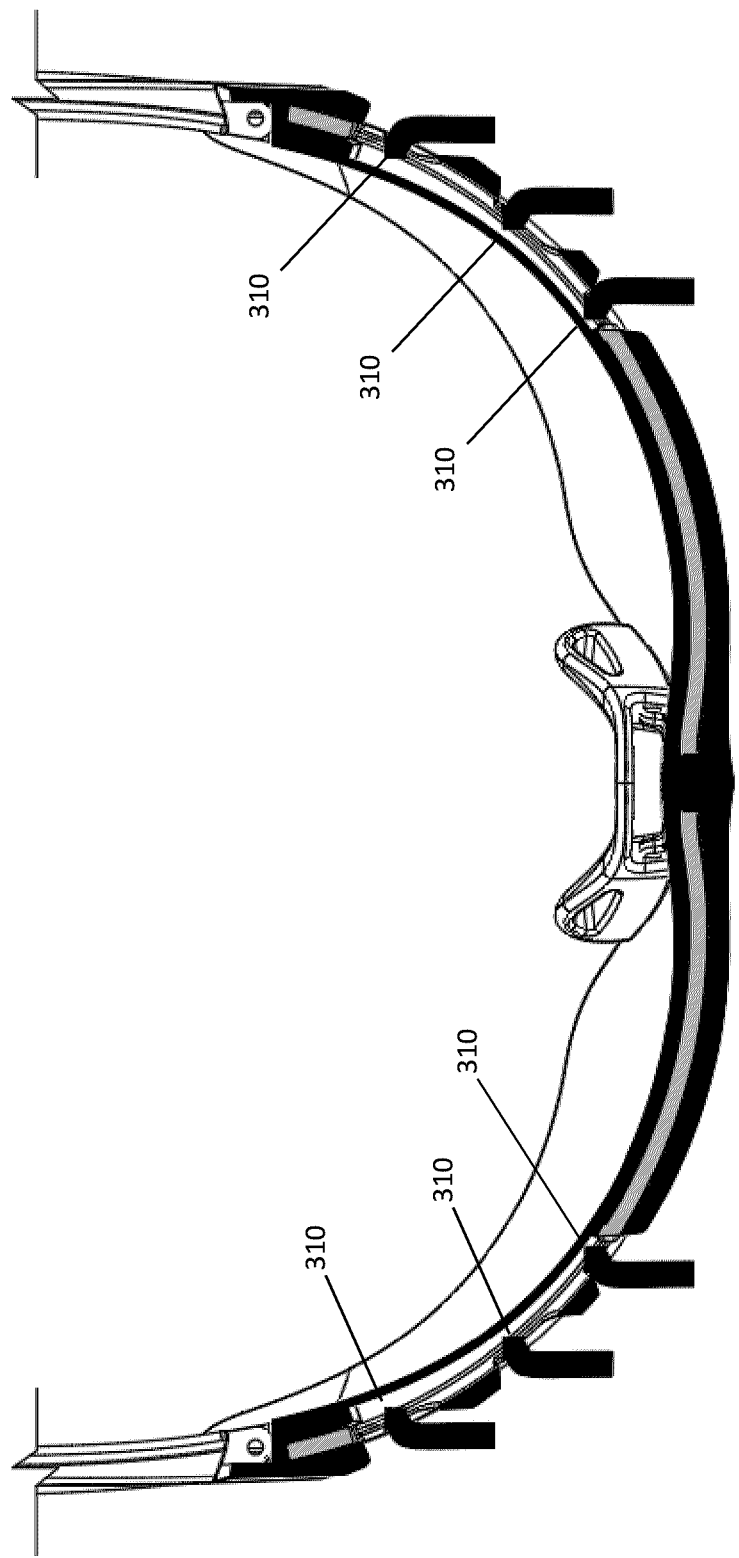
FIG. 6 is a top view of the eyewear assembly having vents shown in FIG. 3.

FIG. 6 provides a top view of the eyewear assembly having vents 310. In this embodiment, it can be appreciated that the air enters each of the vents 310 from a different direction. The vents 310 are angled, which enables the airflow to sufficiently enter the area behind the lens and ventilate the eyewear in a controlled, directed manner.

Figure 7:
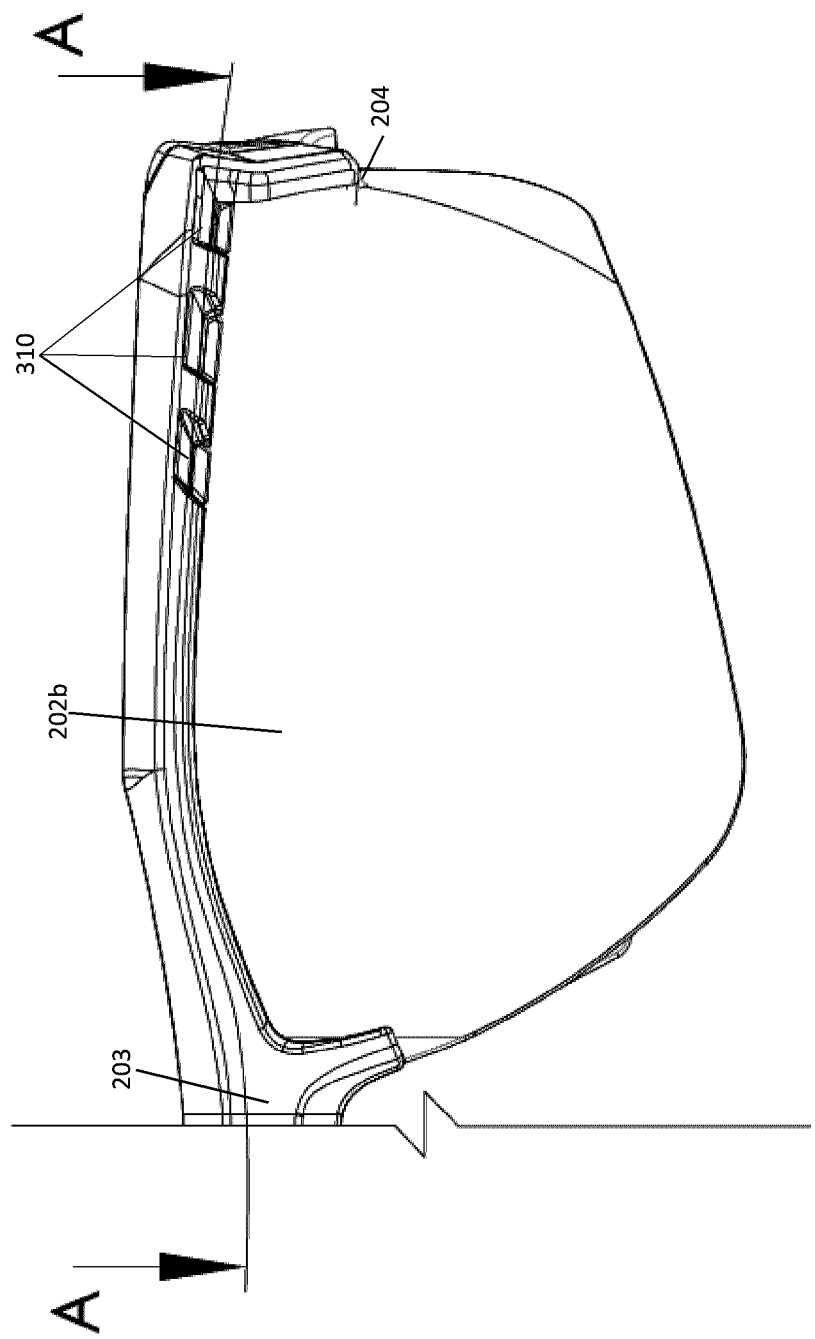
FIG. 7 is a front partial view of eyewear assembly having multidirectional vents.

FIG. 7 is a front partial view of the eyewear having multidirectional vents 310. The vents can be located on one half of the eyewear, but it is preferable that the vents 310 are on both halves of the eyewear. The frame grooves 301 can be grooved or cut deeper than the lens grooves 201. This allows the frame 302 to be manufactured separately from the lens 202 and retrofitted to any lens. This can be useful for example, when an existing pair of lens 202 contain a prescription and need a ventilation system to be added. In this embodiment, the grooves are formed in the frame only, and the frame is retrofitted over the existing lens not having lens grooves. In a separate embodiment, the grooves can be formed in the lens only and retrofitted into an existing frame. In these embodiments, the multidirectional vents 310 are formed by either the frame grooves or the lens grooves alone.

Figure 8:
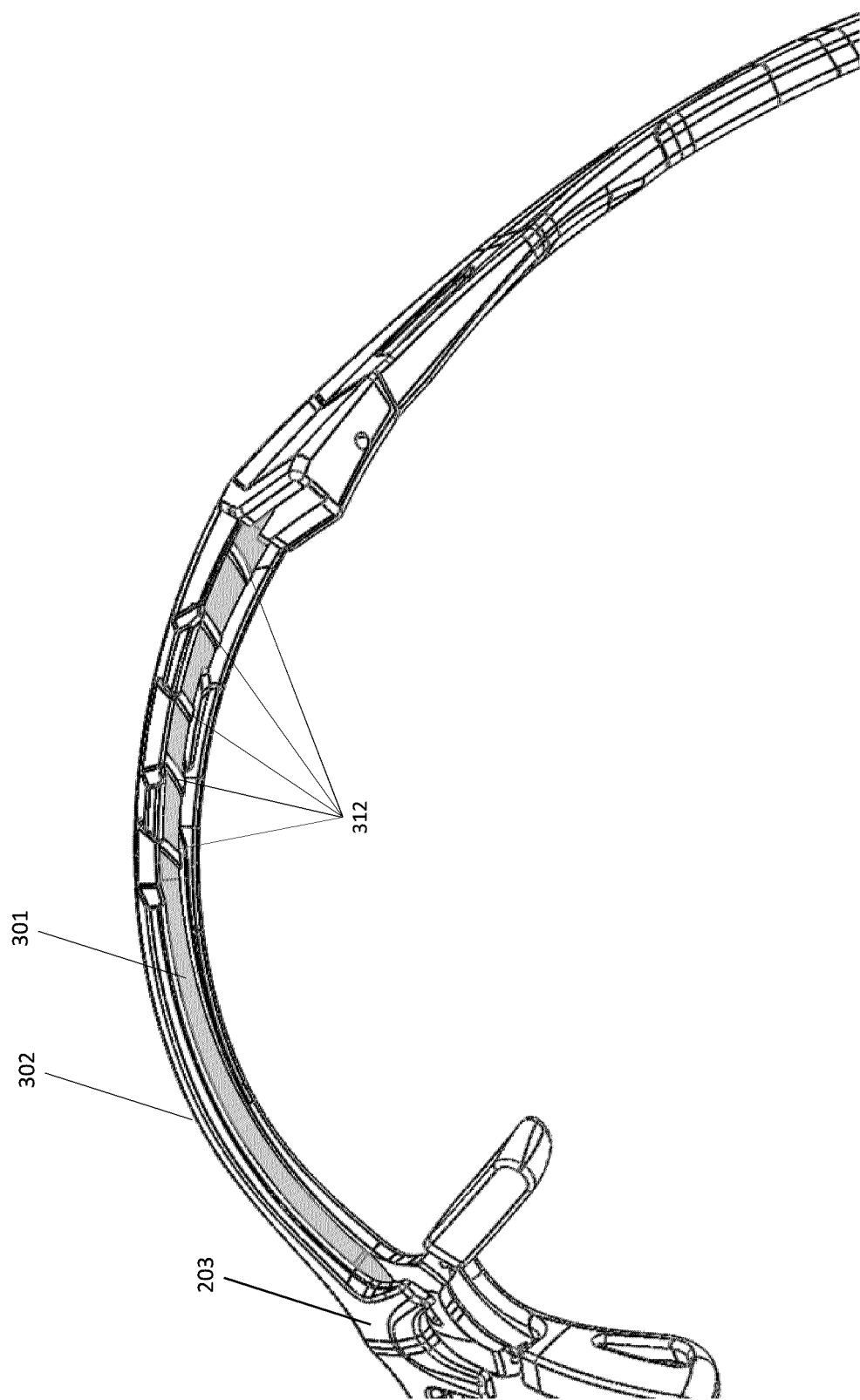
FIG. 8 is a bottom partial perspective view of an eyewear assembly having multidirectional venting and ribs incorporated into the frame.

FIG. 8 shows an alternative embodiment of the eyewear assembly having multidirectional venting. In this embodiment, the frame grooves 301 have ribs 312 incorporated into the frame. The ribs 312 allow the air to be further controlled and directed accordingly. Thus, the air can have more movement and allow for more efficient venting of the eyewear. The ribs 312 can direct and push the air towards the center of the lens, allowing further multidirectional venting.

Figure 9:
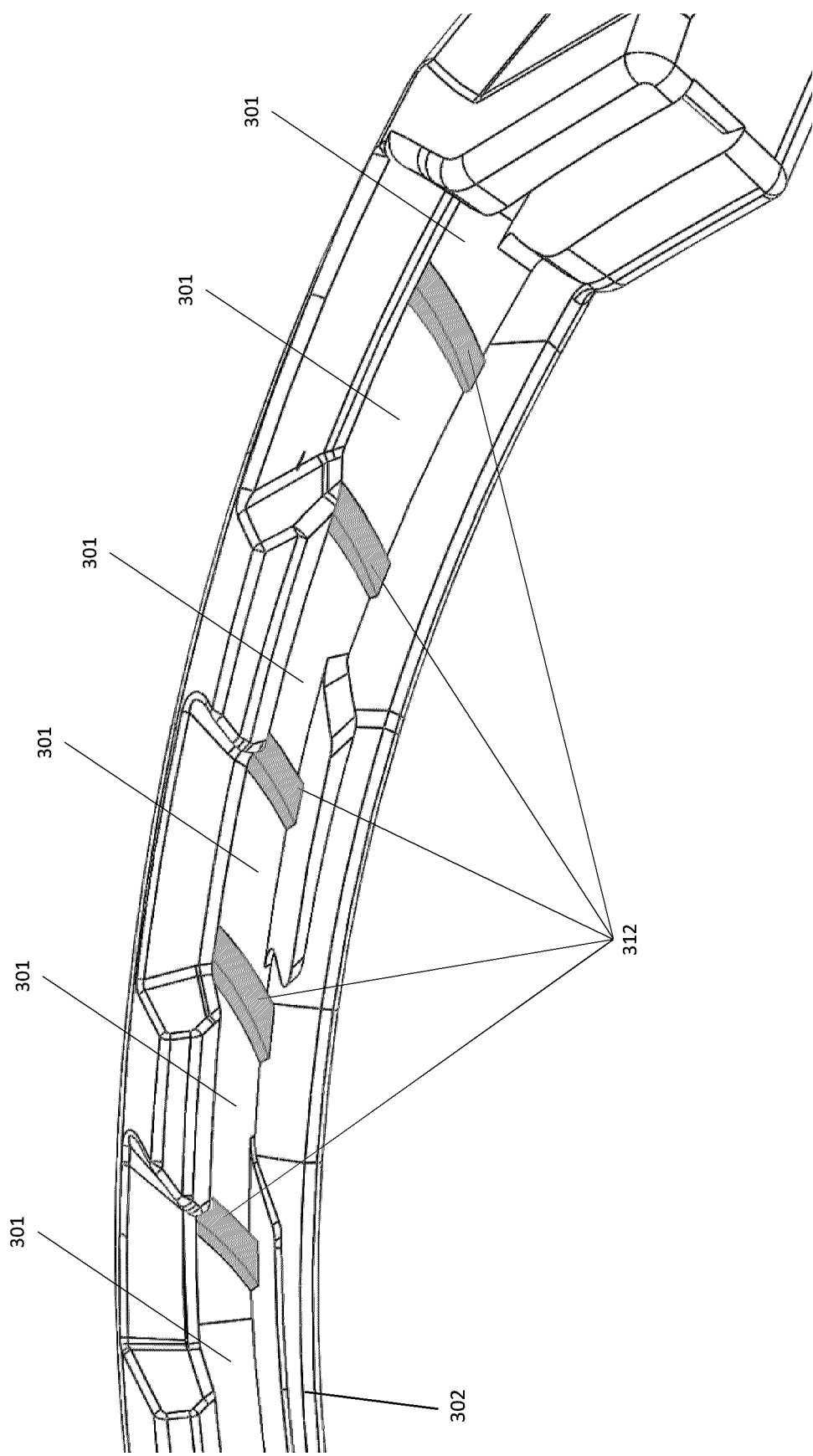
FIG. 9 is a close-up view of the ribs of eyewear assembly shown in FIG. 8.
Figure 10:
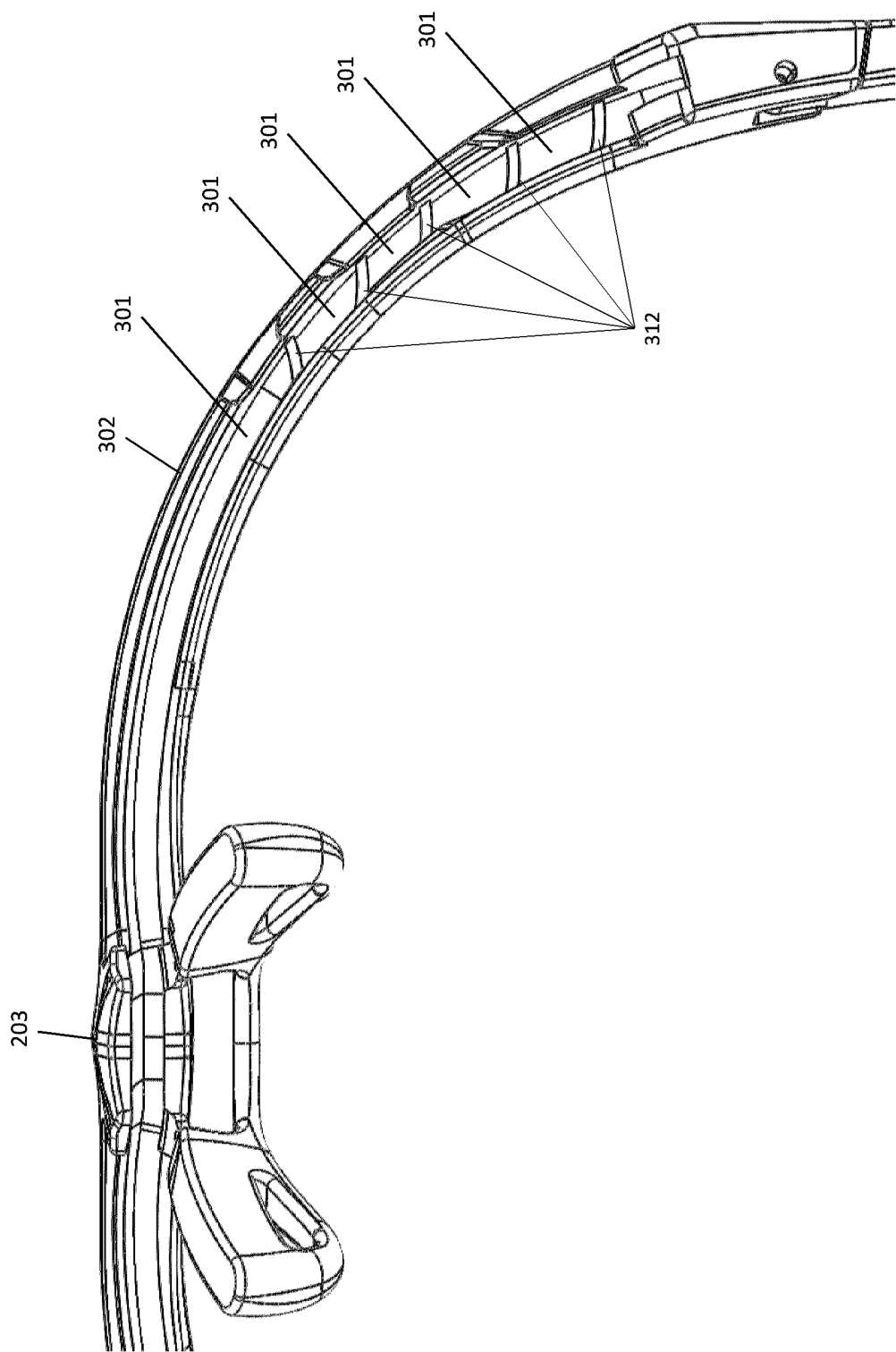
FIG. 10 is a bottom partial view of an eyewear assembly having multidirectional venting and ribs incorporated into the frame.

FIG. 9 is a close-up view of the ribs of eyewear assembly shown in FIG. 8. It can be appreciated that the ribs 312 can be overmoulded to the frame 302. FIG. 10 is a bottom partial view of an eyewear frame 302 showing ribs 312 incorporated into the frame. As it can be seen from FIG. 9, the ribs 312 are located on the frame, behind the frame grooves 301. The air can enter the frame grooves 301 and be directed in a first direction due to the angled grooves. The ribs 312 can then direct the air in a second direction, or further in the first direction. This allows the air to travel in a controlled manner.

The construction of the ribs 312 can be done using any suitable overmolding process. Overmolding, sometimes referred to as two times injection molding, is a process where a single part is created using two or more different materials in combination. Typically, the first material (or substrate) is partially or fully covered by overmolded material during the manufacturing process. In this case, the frame 302 would act as the substrate that is overmolded with the material used to create the ribs 312 thereon, which is generally a softer plastic, rubber, or elastomer (e.g., PTE), or other suitable material. It can be appreciated that the flexible material would typically be overmolded to the frame 302, prior to attaching the assembly to the lenses 202.

The ribs 312 can be any suitable shape. In this embodiment, the ribs 312 are shown to be rectangular in shape. It can be appreciated that the ribs 312 can also be oval or oblong.

Figure 11:
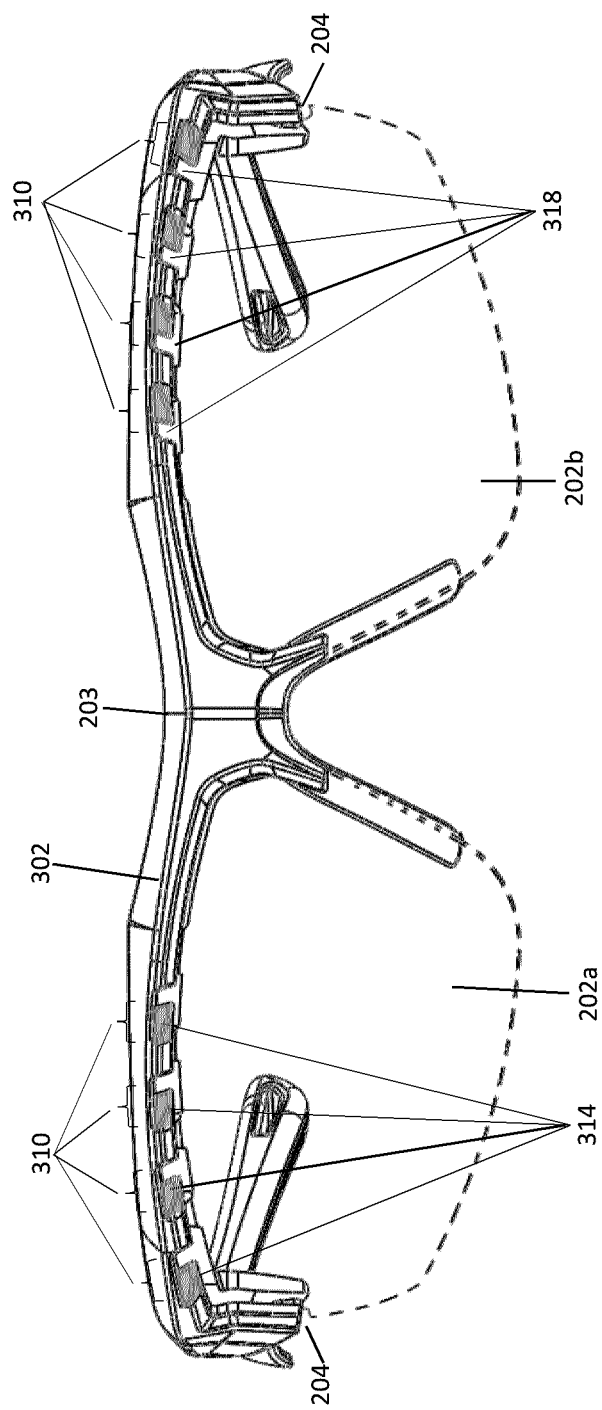
FIG. 11 is a front view of an eyewear assembly having overmoulded portions incorporated into the multidirectional vents.

FIG. 11 is a front view of an eyewear assembly having an alternative rib shape 314. In this embodiment, the ribs 314 have an alternative shape are incorporated into the multidirectional vents 310. The ribs 314 are located within the frame 302 of the eyewear such that when the lens 202 is assembled to the frame, the ribs 314 are located in the multidirectional vents 310. There are no ribs 314 located on the lens itself. The ribs 314 help push the air toward the inside of the eyewear assembly. In this embodiment, the air will travel into the multidirectional vents 310 and hit the back wall 318 directly, where the rib 314 is located. The rib 314 will then guide the air into the eyewear in a controlled manner. It is important to note that in this embodiment, the rib 314 located on the back 318 of the vent 310 will direct the air toward the inside. The ribs 314 shown in the embodiment can be overmoulded to the frame of the eyewear using any suitable overmoulding process.

Figure 12:
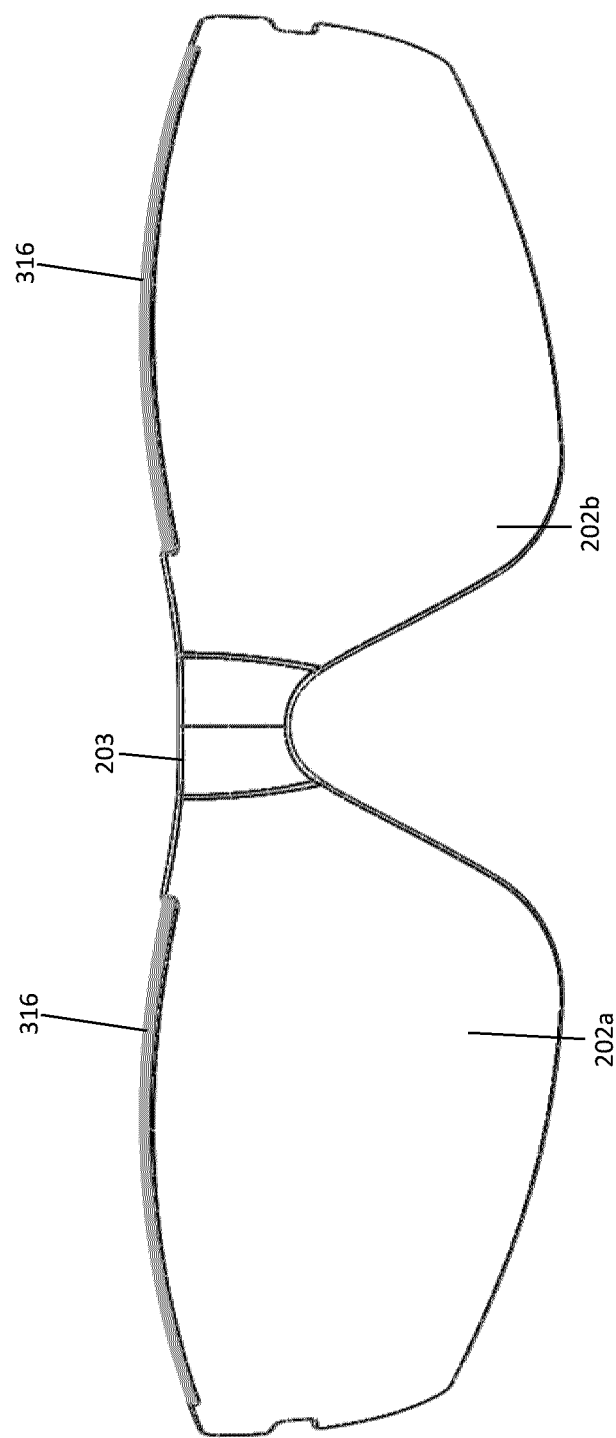
FIG. 12 is a front view of the lens of an eyewear assembly illustrating the venting location.
Figure 13:
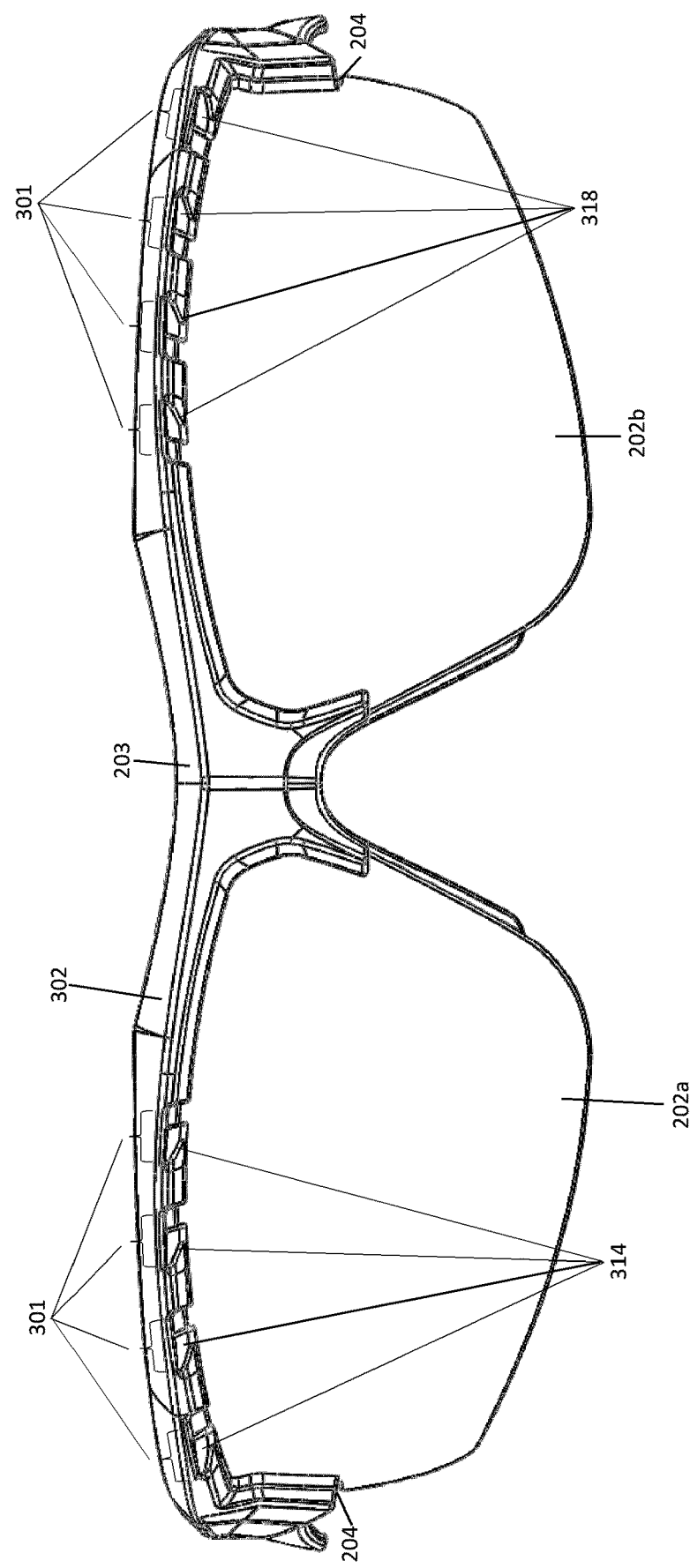
FIG. 13 is a front view of the eyewear assembly having overmoulded ribs.
Figure 14:
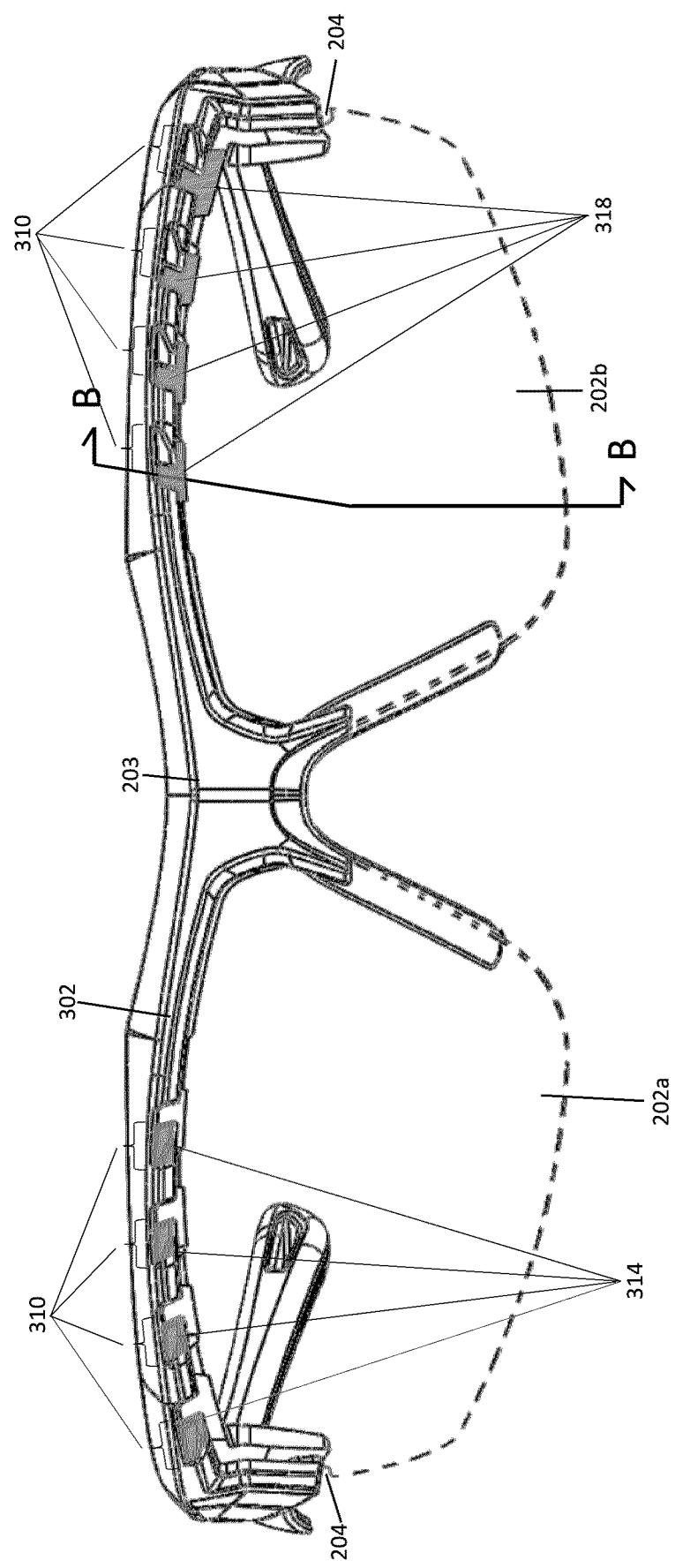
FIG. 14 is a front view of the eyewear assembly having overmoulded ribs.
Figure 15:
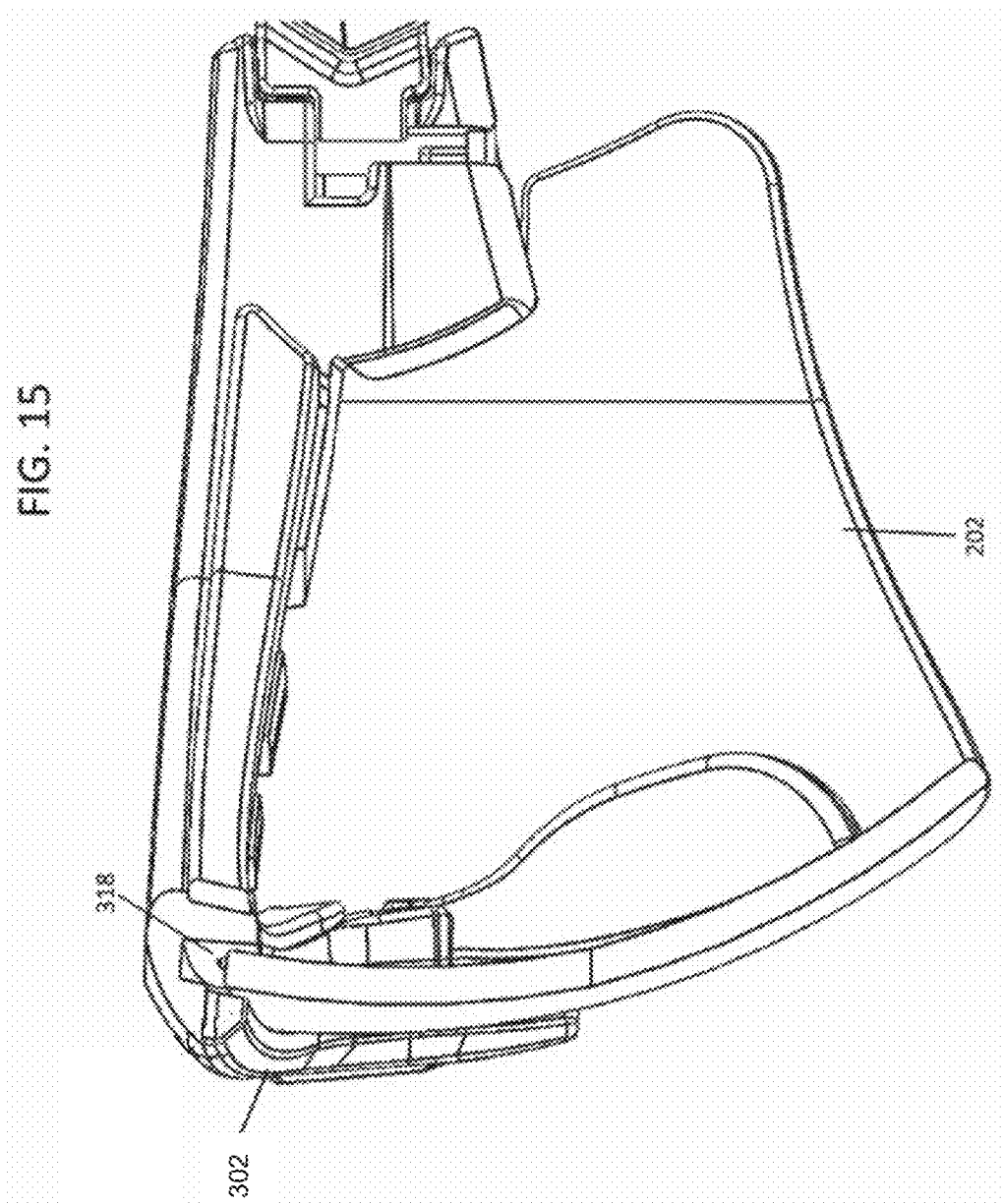
FIG. 15 is a cross-sectional view of the eyewear assembly having overmoulded ribs, shown in FIG. 14 taken along line B-B.

FIG. 12 shows a front view of the lens of an eyewear assembly illustrating the venting location. The venting zone 316 is located on the lens 202 of the eyewear and it defines the venting location. The zone 316 may be indented with lens grooves 201 as shown in FIG. 2. FIGS. 13 and 14 show a front view of the eyewear assembly having overmoulded ribs 314. The incoming air will hit the back wall 318 of the frame first and then the ribs 314 will then direct the air into the eyewear. FIG. 15 shows a cross-sectional view of the eyewear assembly shown in FIG. 14 taken along line B-B.

Figure 16:
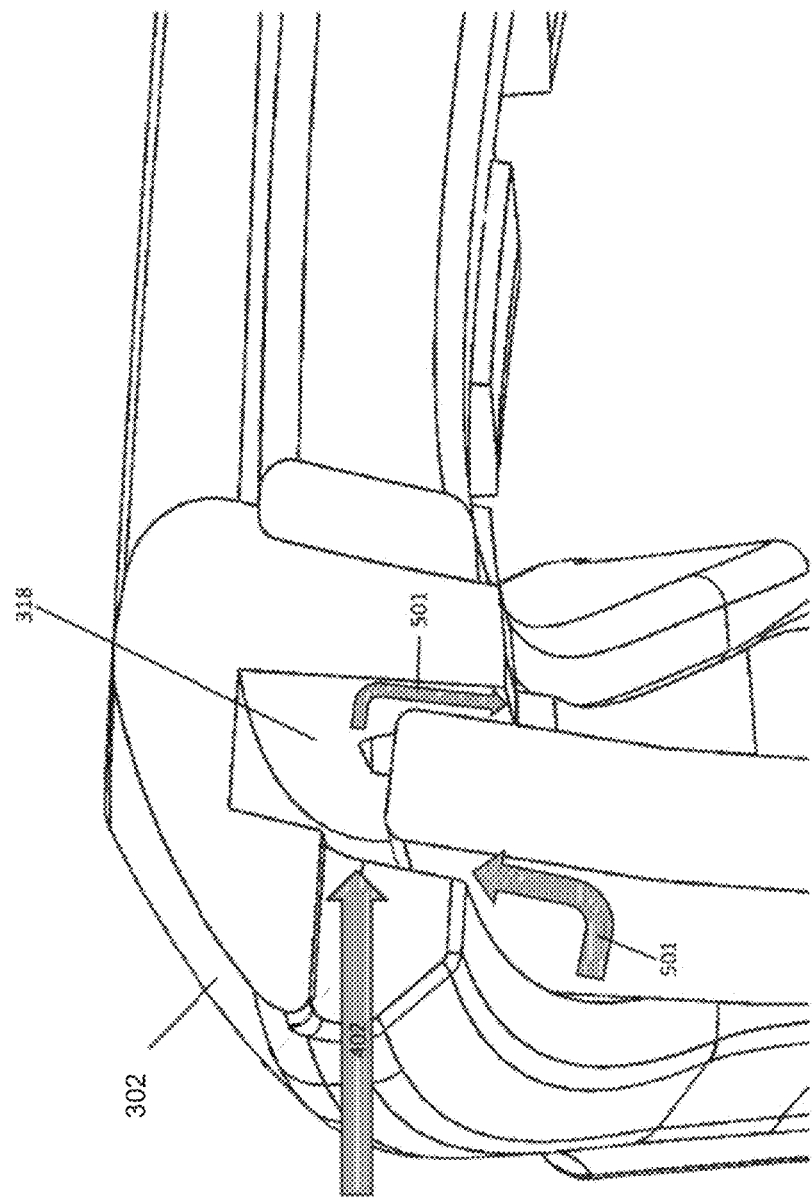
FIG. 16 is a close-up view of the cross-sectional view of the eyewear assembly shown in FIG. 15.

FIG. 16 shows a close-up view of the cross-sectional view of the eyewear assembly shown in FIG. 15. The airflow path is also depicted in FIG. 16. Here, it can be appreciated that the air first hits the back wall 318 of the vent 310. If no rib is present, the air will follow the natural curve of the lens (depicted by arrow 501). If a rib is present, the air will be directed in a controlled manner, and will enter the eyewear accordingly (depicted by arrow 402).

It can be appreciated that the multi-directional vents 310 preferably do not allow air to enter the area behind the lens in a straight path. The airflow is channeled through the grooves and may not follow a straight path. For example, the vents 310 allow air to enter the grooves via a horizontal path 402, the air is then channeled due to the shape of the ribs and into the area behind the lens. The ribs allow the air to be directed in a specific manner. Furthermore, the ribs can be shaped such that the airflow is directed to a region behind the lens which needs more ventilation. For example, the ribs can be angled sharply towards the nose to ventilate the area near the nose more than other areas. Thus, the shape of the ribs provided can alter and guide the airflow as needed. It can be appreciated that by using a greater number of ribs, the ability to redirect air in multiple different directions increases.

When no rib is present in the vent, the lens groove and the frame groove together form a substantially horizontal passage section as well as a substantially vertical passage section which are in fluid communication with each other. When a rib is present in the vent, a further obstruction is present in the vent. Therefore, this allows the formation an "indirect" or L-shaped vent passage extending through the frame structure. The "indirect" OR L-shaped vent passage therefore has an opening thereof on the front side of the frame and an opening on the back side of the frame. The rib can alter the vent passage and therefore affect the airflow. Therefore, the "indirect" or L-shaped vent passage having a rib allows effective moisture venting and air circulation while preventing foreign particles which pass through the vent passages from entering the user's eyes and from impacting the user's face.

Figure 17:
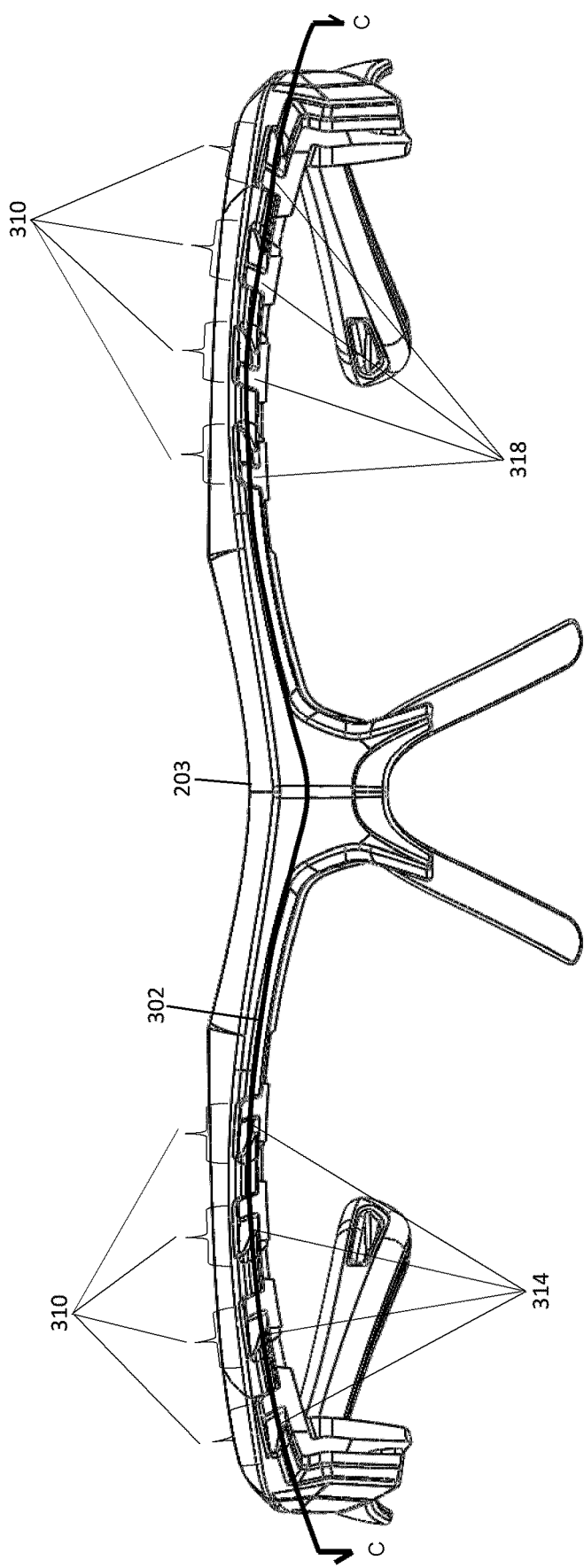
FIG. 17 is a front view of the frame of an eyewear assembly illustrating the ribs incorporated into the multidirectional vents.
Figure 18:
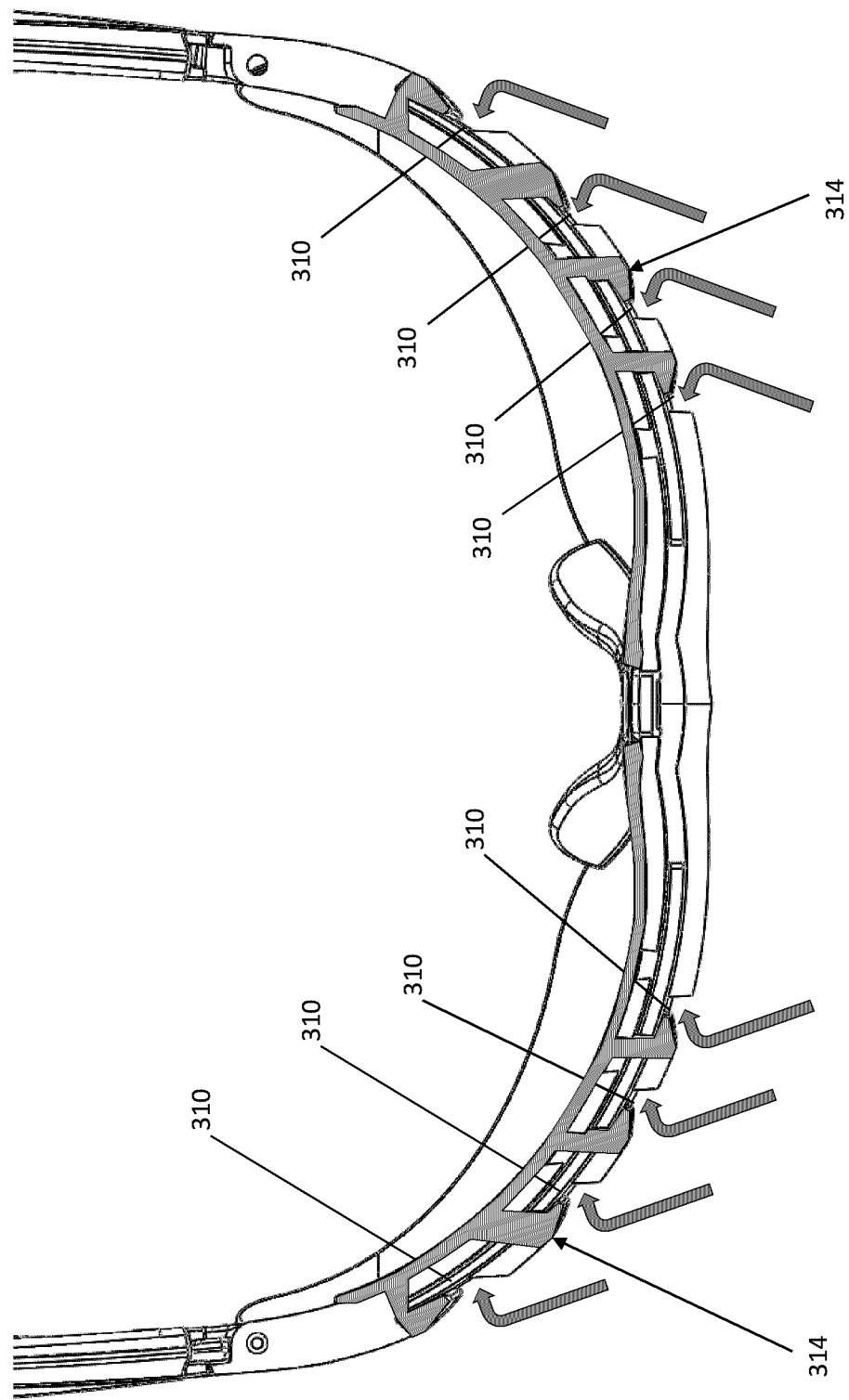
FIG. 18 is a top view of the eyewear assembly illustrating the ribs incorporated into the multidirectional vents.

FIG. 17 shows a front view of the frame of an eyewear assembly illustrating the ribs 314 incorporated into the multidirectional vents 310. FIG. 18 shows a top view of the eyewear assembly illustrating the ribs 314 incorporated into the multidirectional vents 310.

Figure 19:
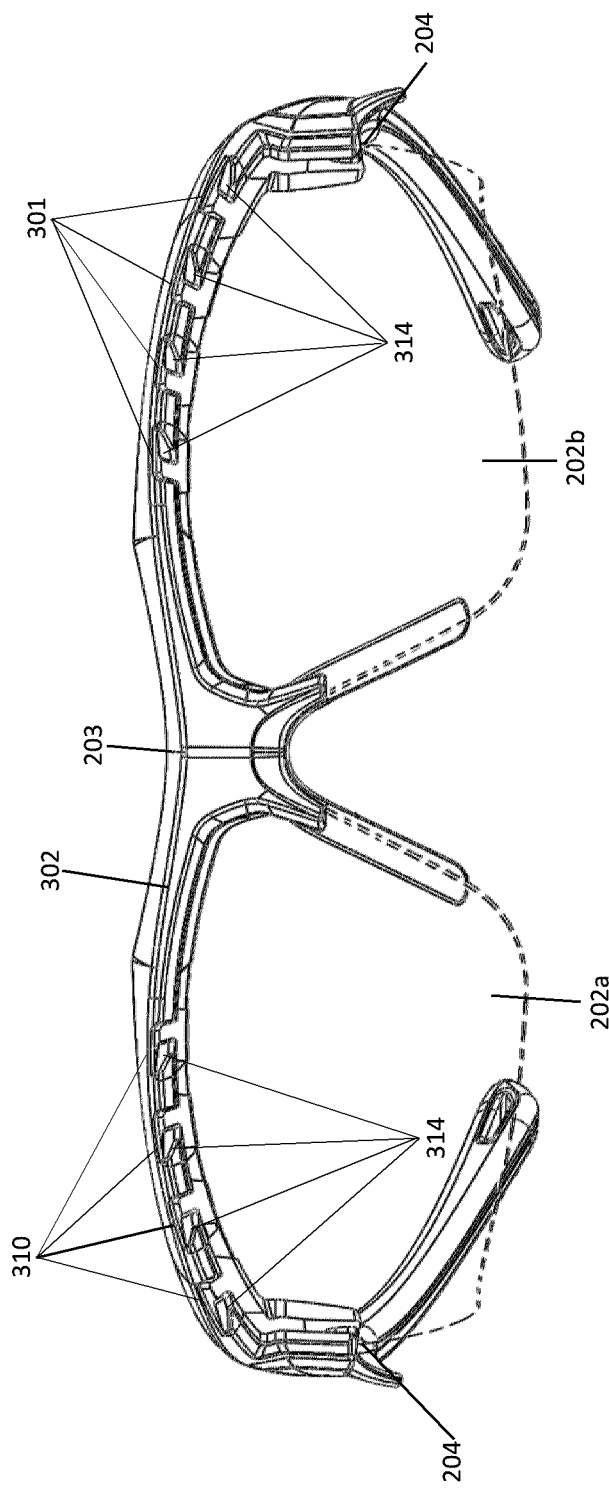
FIG. 19 is a front view of the eyewear assembly shown in FIG. 18.

FIG. 18 provides a top view of the eyewear assembly having vents 310 and ribs 314 present in the vents. In this embodiment, it can be appreciated that the air enters each of the vents 310 from a different direction. The vents are angled, which enables the airflow to sufficiently enter the area behind the lens and ventilate the lens in a controlled, directed manner. FIG. 19 is a front view of the eyewear assembly shown in FIG. 18.

Figure 20:
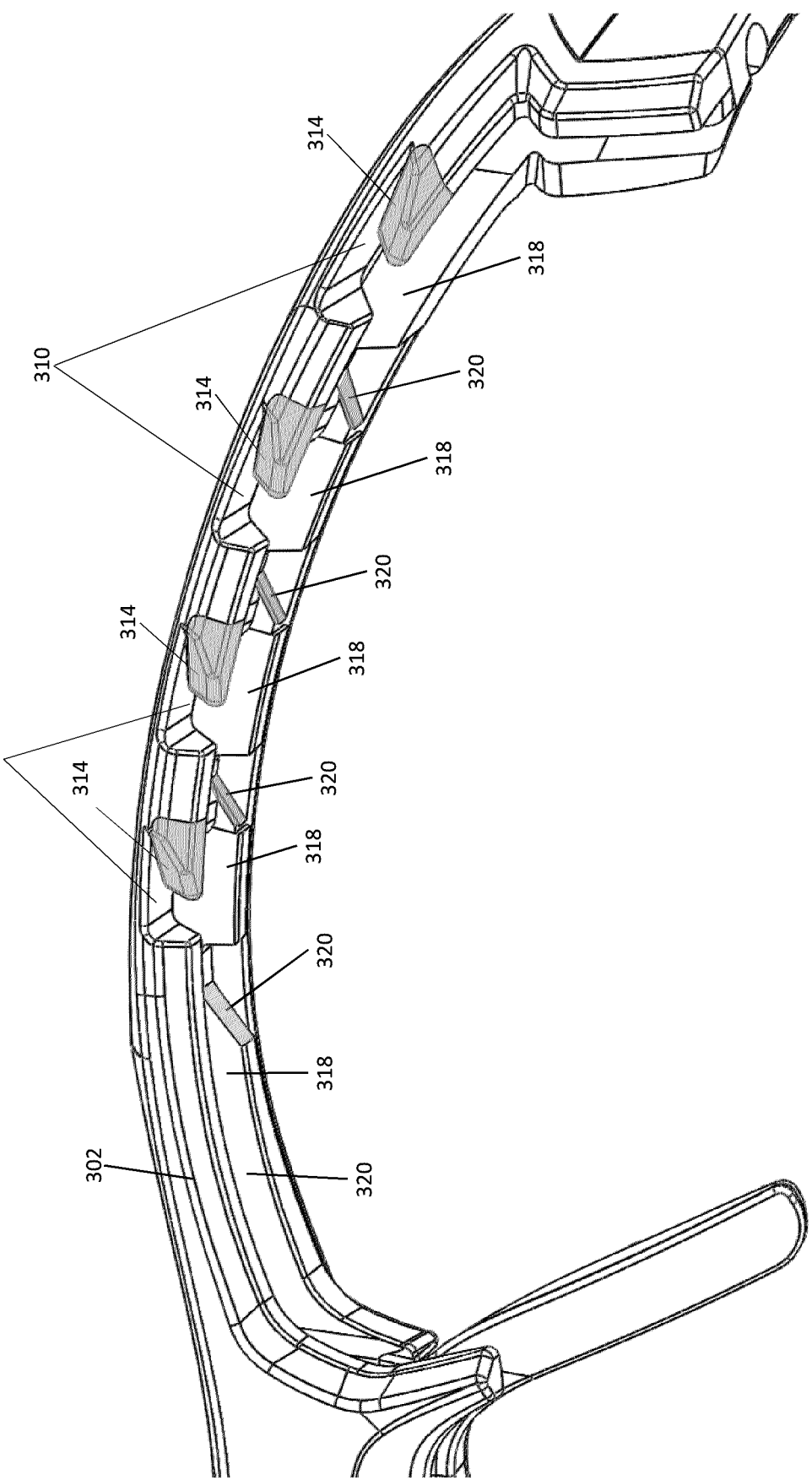
FIG. 20 is a close-up view of the ribs and overmoulded portions incorporated into the multidirectional vents.

FIG. 20 shows a close-up view of the ribs and overmoulded portions incorporated into the multidirectional vents. It can be appreciated that multiple ribs and details can be present in one vent passage. FIG. 20 shows a first rib 314, and a second rib 320 working in parallel to re-direct air into the inside of the eyeglasses.

Figure 21:
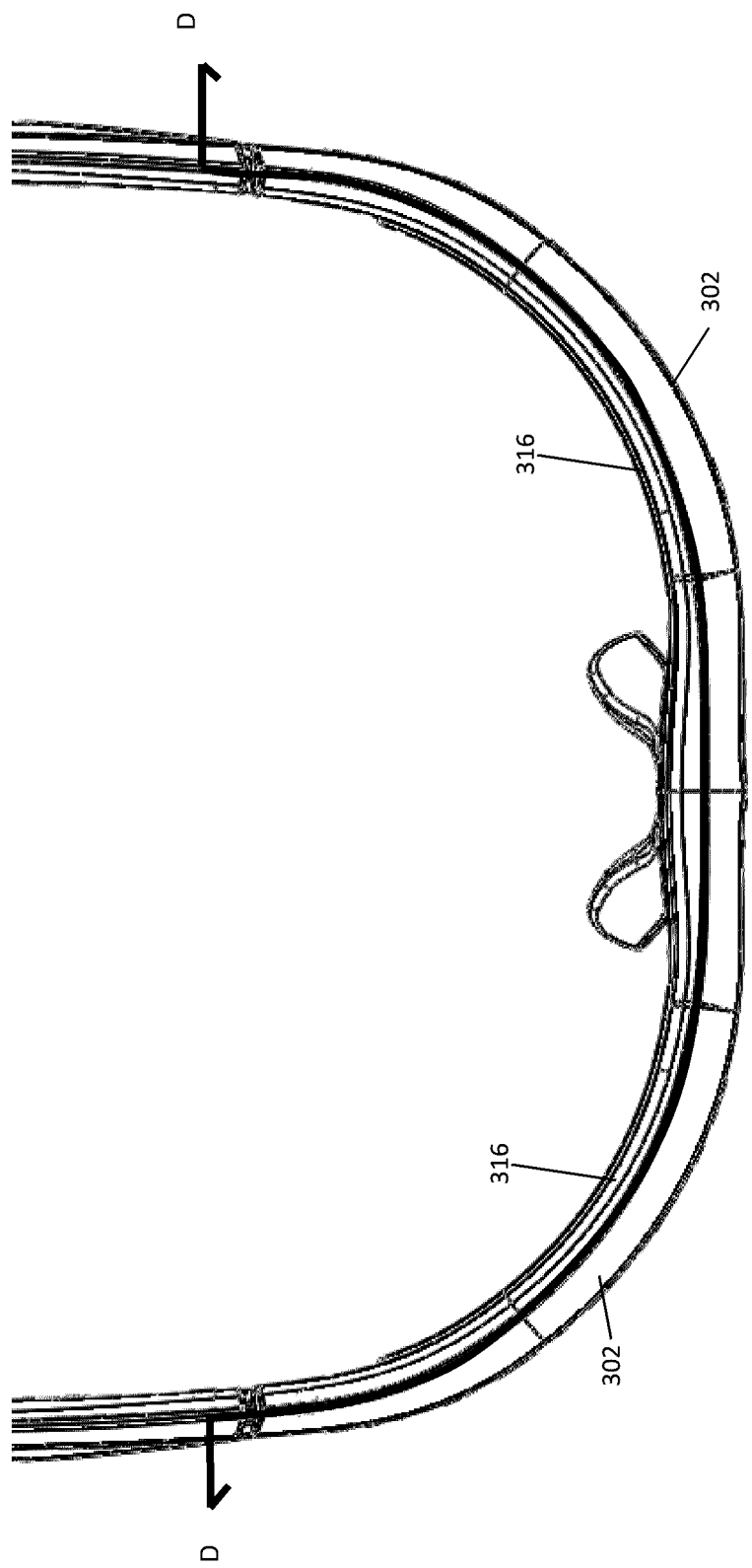
FIG. 21 is a top view of the frame of the eyewear assembly shown in FIG. 17.
Figure 22:
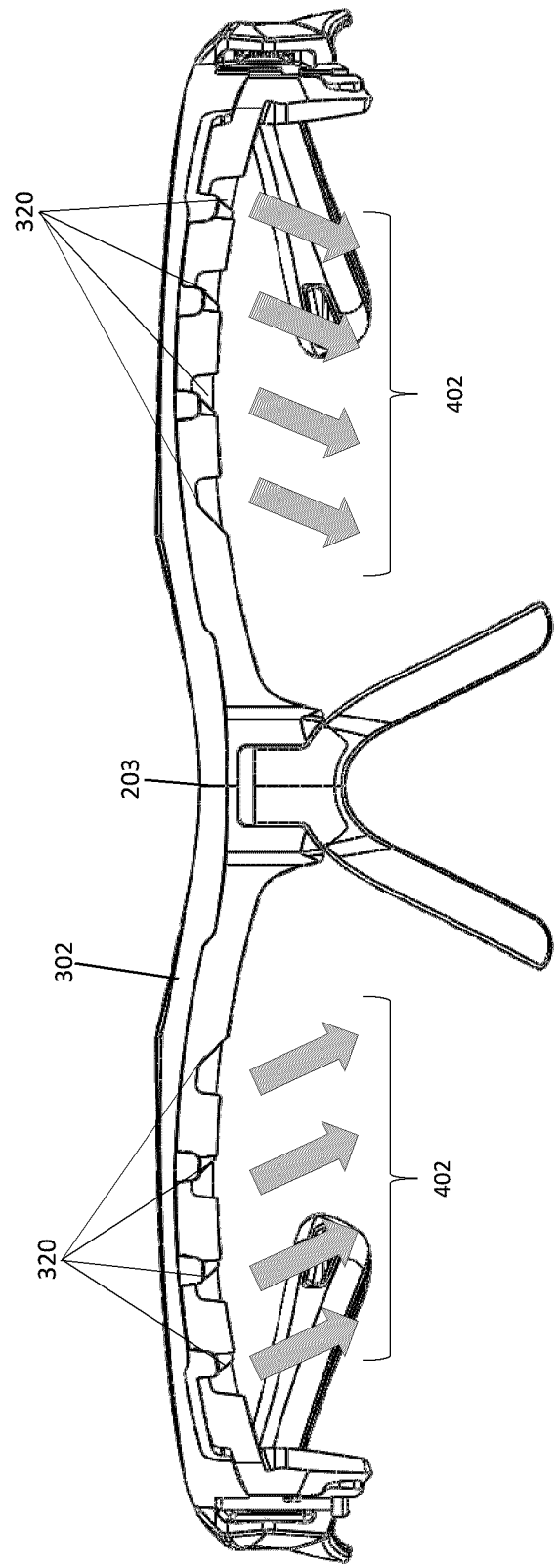
FIG. 22 is a front view of the frame of the eyewear assembly shown in FIG. 21.
Figure 23:
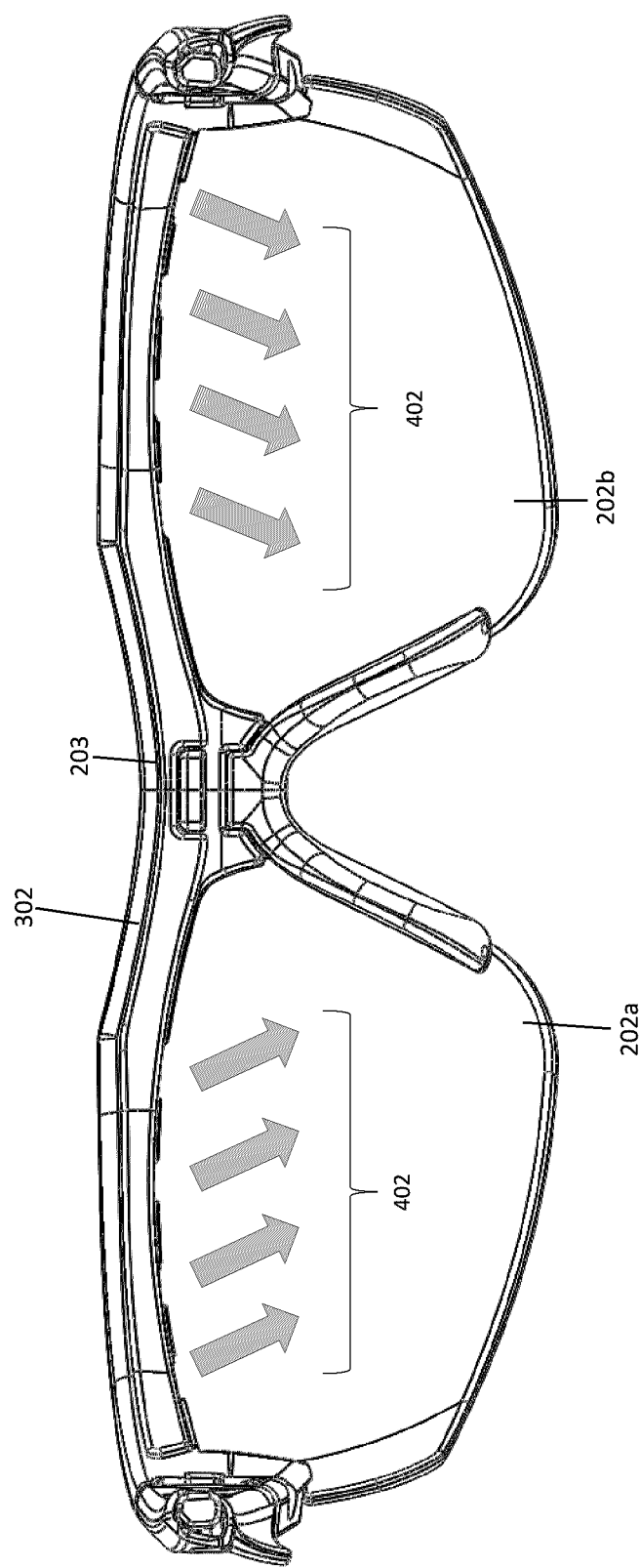
FIG. 23 is a rear view of the eyewear assembly shown in FIG. 22.
Figure 24:
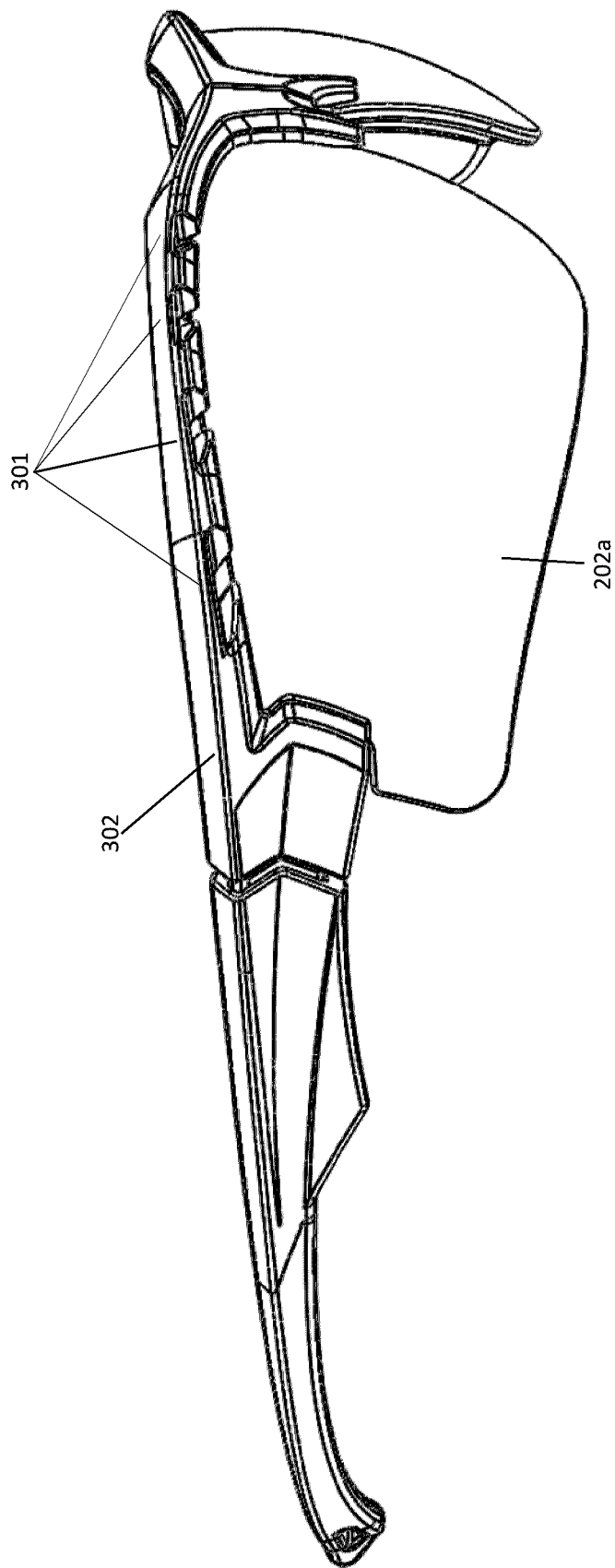
FIG. 24 is a photograph showing a side view of the eyewear assembly having multidirectional venting.
Figure 25:
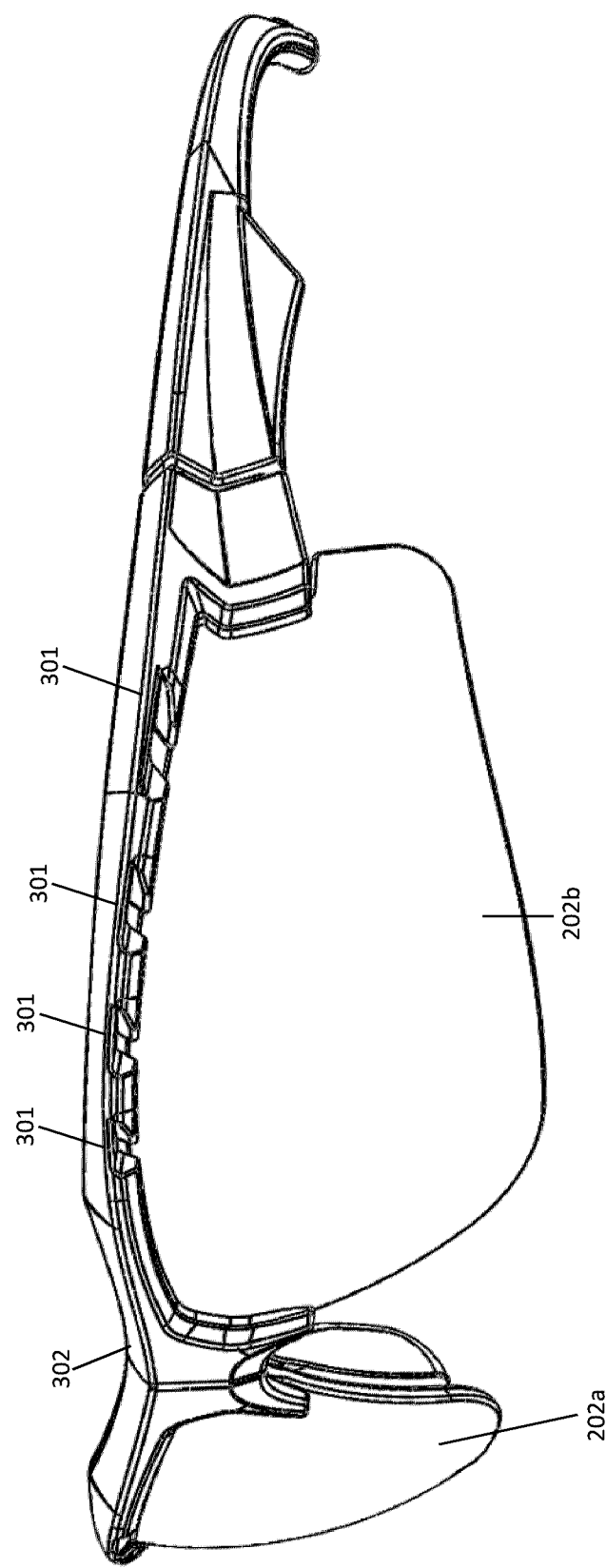
FIG. 25 is a photograph showing a diagonal view of the eyewear assembly of FIG. 24.

FIG. 21 is a top view of the frame of the eyewear assembly shown in FIG. 17. FIG. 22 is a front view of the frame of the eyewear assembly shown in FIG. 21. FIG. 23 is a front view of the eyewear assembly shown in FIG. 22.

A method of producing eyewear having multidirectional vents is also provided. Multiple lens grooves 201 can be formed on the lens portion 202. The lens grooves 201 can be formed using a CNC machining method or by injection molding the lens portion 202 having grooves 201, or a similar method known in the art. The nose bridge portion 203 can be formed separately from the pair of lens portions 202a and 202b. Multiple frame grooves 301 can be formed on the frame portion 302. The frame grooves 301 can also be formed using a CNC machining method or by injection molding the frame portion having grooves 301. The frame portion can be joined to the lens portion, aligning the lens grooves 201 to the frame grooves 301, and forming vents 310. The forming lens grooves 201 step involves cutting the lens grooves such that the lens grooves are angled in a plurality of directions. The forming frame grooves 301 step involves cutting the frame grooves 301 such that the frame grooves 301 are angled in a plurality of directions.

For simplicity and clarity of illustration, where considered appropriate, reference numerals may be repeated among the figures to indicate corresponding or analogous elements. In addition, numerous specific details are set forth in order to provide a thorough understanding of the examples described herein. However, it will be understood by those of ordinary skill in the art that the examples described herein may be practiced without these specific details. In other instances, well-known methods, procedures, and components have not been described in detail so as not to obscure the examples described herein. Also, the description is not considered as limiting the scope of the examples described herein.

It will be appreciated that the examples and corresponding diagrams used herein are for illustrative purposes only. Different configurations and terminology can be used without departing from the principles expressed herein. For instance, components and modules can be added, deleted, modified, or arranged with differing connections without departing from these principles.

Although the above principles have been described with reference to certain specific examples, various modifications thereof will be apparent to those skilled in the art as outlined in the appended claims.

The invention claimed is:

1. Eyewear comprising: a lens portion; a frame portion coupled to the lens portion via an attachment mechanism; a plurality of lens grooves located on a front wall of the lens portion and shaped to match the lens grooves; and the lens grooves align with the frame grooves to form a vent when the lens portion is coupled to the frame portion; wherein the lens grooves have a width equal to a width of the frame grooves and are angled in a plurality of directions; the vent allows air to enter the eyewear such that the air is directed in the plurality and directions; and wherein the frame portion comprises the front wall, and a back wall; said eyewear further comprising ribs extending between the front wall and back wall and aligned with the vent for directing the air further into the eyewear in a controlled manner.

2. The eyewear according to claim 1, wherein the ribs are overmoulded to the frame.

3. The eyewear according to claim 1, wherein the vent comprises a plurality of ribs.

4. A method of producing eyewear comprising:
   forming lens grooves in a lens portion;
   forming frame grooves in a frame portion; and
   joining the frame portion to the lens portion such that the lens grooves are aligned with the frame grooves to form a vent;
   wherein the lens grooves are angled in a plurality of directions; and
   wherein the frame portion comprises the front wall, and a back wall; said eyewear further comprising ribs; extending between the front wall and the back wall and aligned with the vent for directing the air further into the eyewear in a controlled manner; and wherein the vent allows air to enter the eyewear such that the air is directed in the plurality of directions.

5. The eyewear according to claim 1 wherein there are a plurality of vents, each with a rib; each rib associated with each of the plurality of vents having a unique orientation such that the air through each of the plurality of vents is directed into the eyewear in different directions.

6. The eyewear according to claim 5 wherein the plurality of vents comprises at least 3 vents.

7. The eyewear according to claim 6 wherein the at least 3 vents comprises a first vent located closest to a midline of the eyewear, a third vent located closest to a lateral edge of the eyewear and a second vent located between said first vent and said third vent.

8. The eyewear according to claim 7 wherein the first vent directs air towards an inner portion of the lens, the second vent directs air along a midline of the lens, and the third vent directs air through a bottom of the lens.

* * * * *